United States Patent
Sakao

(10) Patent No.: US 6,696,720 B2
(45) Date of Patent: Feb. 24, 2004

(54) SEMICONDUCTOR DEVICE HAVING STACKED CAPACITOR AND PROTECTION ELEMENT

(75) Inventor: Masato Sakao, Tokyo (JP)

(73) Assignee: NEC Electronics Corporation, Kawasaki (JP)

(*) Notice: Subject to any disclaimer, the term of this patent is extended or adjusted under 35 U.S.C. 154(b) by 0 days.

(21) Appl. No.: 10/131,045

(22) Filed: Apr. 25, 2002

(65) Prior Publication Data

US 2002/0179949 A1 Dec. 5, 2002

(30) Foreign Application Priority Data

Apr. 26, 2001 (JP) ........................................ 2001-129188

(51) Int. Cl.$^7$ ........................ H01L 27/108; H01L 29/76; H01L 29/94; H01L 31/119

(52) U.S. Cl. ........................................ 257/306; 257/309

(58) Field of Search ................................ 257/295–310; 438/3, 240–254, 396–398

(56) References Cited

U.S. PATENT DOCUMENTS 6,090,697 A * 7/2000 Xing et al. .................. 438/253
6,291,847 B1 * 9/2001 Ohyu et al. .................. 257/306

* cited by examiner

Primary Examiner—Cuong Nguyen
(74) Attorney, Agent, or Firm—McGinn & Gibb, PLLC

(57) ABSTRACT

A semiconductor device of the present invention comprises a capacitor portion composed of a lower electrode, a capacitor insulator film, and an upper electrode sequentially stacked on an inter-layer insulator film on a semiconductor substrate; and a charging protection portion sharing the capacitor insulator film and the upper electrode. The lower electrode is electrically connected through a first contact plug provided in the inter-layer insulator film finally to a first diffused layer formed in the semiconductor substrate surface, the capacitor insulator film of the charging protection portion is adhered to a second contact plug provided in the inter-layer insulator film, the contact plug is electrically connected finally to a second diffused layer formed in the semiconductor substrate surface, and the lower electrode is made of a first conductive material and the first and second contact plugs are made of a second conductive material different from the first conductive material.

11 Claims, 9 Drawing Sheets

SEMICONDUCTOR DEVICE HAVING STACKED CAPACITOR AND PROTECTION ELEMENT

BACKGROUND OF THE INVENTION

1. Field of the Invention

The present invention relates to a semiconductor device and, more particularly to, a semiconductor device capable of preventing electrostatic breakdown of its capacitor portion in a manufacturing process thereof.

2. Description of the Related Art

Of various semiconductor devices, a DRAM is capable of inputting/outputting of any information stored therein. Especially, such a memory device of DRAM comprised of memory cells each consisting of one transfer transistor and one capacitor is simple in construction and best in improvement in integration density of the semiconductor device, thus being prevalent in use all over the world.

Besides, a system LSI is considered to be important among the recent semiconductor devices. Among these semiconductor devices, a variety of mixed devices have been developed and discussed such as a logic circuit-mixed memory device in which logic and memory circuits are implemented on the same semiconductor chip, an analog circuit-mixed logic device in which logic and analog circuits are implemented on the same chip, etc. In these mixed devices also, as described above, each memory cell consists of one transfer transistor and one capacitor.

As the above-mentioned capacitor of each memory cell, such a three-dimensional one has been developed and used to accommodate a further increase in integration density of the semiconductor device. The capacitor has thus been made three dimensional for the following reasons. That is, it is essential to reduce the area occupied by the capacitor as the semiconductor device has been made finer in patterning and higher in integration density. To preserve stability and reliability in operation of the memory section of the semiconductor device, however, the capacitor must have at least a certain value of capacitance. As such, it has been necessary to change the construction of the capacitor electrode from a planar one to a three-dimensional one in order to increase the surface area of a lower electrode (information storing electrode) within a reduced occupied area.

There are two types of the three-dimensional constructions of the memory cell capacitors: a stack construction and a trench construction. Although they have merits and demerits, the stack construction has a higher margin against an α-particle from the outside and noise from circuitry and so is stable in operation with a relatively small value of capacitance. For this reason, capacitors of the stack construction are regarded to be effective even with a design rule of 0.10 μm or so of the semiconductor device.

Recently, the stack-construction capacitor (hereinafter called stack type capacitor) is required to have a dielectric film (capacitor insulator film) having a very high permittivity in order to preserve a predetermined value of capacitance in a small area region. As the high-permittivity film, such insulator films have been discussed aggressively as tantalum penta-oxide ($Ta_2O_5$) film, a $SrTiO_3$ (hereinafter called STO film), (Ba, Sr)$TiO_3$ (hereinafter called BST film), Pb(Zr, Ti)$O_3$ (hereinafter called PZT film), etc. Further, a new conductive material has been required to make a lower electrode of the stack type capacitor. It is necessary to appropriately combine the above-mentioned high-permittivity insulating material and the lower electrode to thereby preserve a high reliability of the capacitor.

The following will describe a construction of a memory cell having a stack type capacitor made of a conventional high-permittivity film and a process for manufacturing the same with reference to FIGS. 8 and 9. FIG. 8 is a plan view for showing an end of a memory cell. FIG. 9 is a cross-sectional view taken along line C–D of FIG. 8. It is here to be noted that in FIG. 8, to make a problem clear, the cell plate electrode of a memory cell is hatched. Moreover, to simplify the drawing, only necessary components are shown, omitting the others.

As shown in FIG. 8, an element activation region surrounded by a trench element isolation region is formed. In each element activation region 102 are formed two memory cells. To connect these memory cells, word lines 102, 102a, 102b, 102c, 102d, 102e, 102f, 102g, etc. are arranged. Further, in capacitors of the memory cells are formed capacitor contact holes 103, 103a, . . . , respectively, over which are formed capacitor trenches 104, 104a, respectively in an inter-later insulator film described later. To cover this memory cell region thoroughly, a cell plate electrode 116 is formed.

Next, the manufacture of the above-mentioned memory cells is outlined with reference to FIG. 9. As shown in FIG. 9A, for example, on a P type silicon substrate 105 are selectively formed trench isolation regions 106 and 106a to thereby form the above-mentioned element activation region 101. On the silicon substrate 105 and the trench isolation regions 106 and 106a are in turn formed word lines 102 and 102a and word lines 102b, 102c, and 102d respectively through a gate insulator film which provides a transfer-gate transistor of the memory cell. Then, a diffusion layer is formed in these word lines and trench element isolation regions in self-alignment to thereby form a diffused layer 107 for the bit line and diffused layers 108 and 108a for the capacitor.

Next, a first inter-layer insulator film 109 is formed to flatten the surface thoroughly. In this first inter-layer insulator film 109, a bit-line contact hole 110 is formed extending to the above-mentioned bit-line diffused layer 107 and filled with a bit-line plug 111. Similarly, in the above-mentioned first inter-layer insulator film 109, capacitor contact holes 103 and 103a are formed extending to the capacitor diffused layers 108 and 108a respectively and filled with capacitor plugs 112 and 112a respectively. It is here to be noted that the bit-line plug 111 and the capacitor plugs 112 and 112a are formed of a tungsten (W) film with a titanium nitride (TiN) film used as a barrier layer.

Next, a second inter-layer insulator film 113 is formed to flatten the above-mentioned first inter-layer insulator film 109, thus forming capacitor trenches 104 and 104a in a predetermined region. On the side surface and the bottom surface are in turn formed capacitors lower electrodes 114 and 114a respectively. It is here to be noted that the lower electrodes 114 and 114a are formed of a TiN film.

Next, a capacitor insulator film 115 is formed throughout the surface to cover a cell-plate metal film in order to form cell plate electrode 116. It is here to be noted that the capacitor insulator film 115 is made of tantalum penta-oxide formed to a thickness of 10 nm or so, while the cell-plate metal film is made of TiN. A resist mask 117 is used as an etching mask to pattern the above-mentioned cell-plate metal film by dry etching into a cell-plate electrode 116. An etchant gas used in this dry etching step is obtained by plasma-exciting a mixed gas composed of chloride ($Cl_2$) and hydrogen bromide (HBr). It is here to be noted that by this dry etching step, the capacitor insulator film 115 is etched off partially.

Next, as shown in FIG. 9B, a third inter-layer insulator film 118 is formed to flatten the surface and cover the cell plate electrode 116. It is here to be noted that the third inter-layer insulator film 118 is obtained by flattening by Chemical Mechanical Polishing (CMP) a silicon oxide film formed by bias ECR (Electron Cyclotron Resonance).

Next, as shown in FIG. 9C, the above-mentioned third inter-layer insulator film 118 and the second inter-layer insulator film 113 are dry-etched to form a through hole 119 extending to the bit-line plug 111. Moreover, by the above-mentioned dry etching step, a cell-plate opening 120 is formed in the above-mentioned third inter-layer insulator film 118 so that it may reach the surface of the cell plate electrode 116.

Thus, the above-mentioned through hole 119 and cell-plate opening 120 are filled with a through-hole plug 121 and a cell-plate plug 122 respectively. Then, a bit line 123 is formed so as to connected to the above-mentioned through-hole plug 121, while a cell-plate wiring line 124 is arranged so as to connect to the above-mentioned cell-plate plug 122.

The inventor discussed in detail an MIM (Metal/Insulator/Metal) construction capacitor using the above-mentioned high-permittivity material as its capacitor insulator film. As a result, it was found that in an MIM construction capacitor, the above-mentioned capacitor insulator film frequently undergoes dielectric breakdown (electrostatic breakdown) during the process of manufacturing a semiconductor device if this capacitor insulator film is made of such oxidized metal as tantalum penta-oxide, zirconium dioxide ($ZrO_2$), hafnium dioxide ($HfO_2$), STO, BST, PZT, etc. As such, the inventor checked in detail the semiconductor device manufacturing process.

This phenomenon of electrostatic breakdown of the capacitor insulator film is described with reference to FIGS. 9 as follows. At the step of dry-etching the cell-plate metal film described with reference to FIG. 9A, the cell-plate metal film is charged by a number of ions or electrons produced by plasma excitation of the etchant gas. Such charging at the time of dry-etching step may break down the capacitor insulator film 115 dielectrically in some cases.

Furthermore, at the step of forming the third inter-layer insulator film 118 described with reference to FIG. 9B, plasma-enhanced CVD (PECVD) by use of HDP (High Density Plasma) is employed. In this case also, the cell plate electrode 116 is charged by a number of ions or electrons. Such charging at the time of film forming step will break down the capacitor insulator film 115 dielectrically.

Further, at the step of dry etching described with reference to FIG. 9C for forming the through hole 119 and the cell plate opening 120, a fluoro-carbon-based halogen compound is plasma-excited is used as the etchant gas. In this case also, the cell plate electrode 116 is charged by the ions or electrons in the plasma. In this case, the through hole 119 must be formed by performing dry etching on the third inter-layer insulator film 118 and the second inter-layer insulator film 113. The cell plate opening 120, however, is formed by performing dry etching on the third inter-layer insulator film 118. As such, at the time of dry etching of the above-mentioned second inter-layer insulator film 113 after the above-mentioned third inter-layer insulator film 118 is etched, the cell plate electrode 116 is exposed to the above-mentioned plasma for long time. The capacitor insulator film 115 is, therefore, broken down dielectrically by charging at the time of this dry etching step.

SUMMARY OF THE INVENTION

It is an object of the present invention to provide a semiconductor device having an MIM construction capacitor that can prevent a capacitor insulator film of the capacitor from breaking down dielectrically due to charging at a step of manufacturing the semiconductor device.

A semiconductor device of the present invention comprises: a capacitor portion composed of a lower electrode, a capacitor insulator film, and an upper electrode; and a charging protection portion sharing the upper electrode and the capacitor insulator film. The lower electrode is electrically connected through the first contact plug provided in the inter-layer insulator film finally to the first diffused layer formed in the surface of the semiconductor substrate, the capacitor insulator film of the charging protection portion is adhered to the second contact plug provided in the inter-layer insulator film, which second contact plug is finally connected electrically to the second diffused layer formed in the surface of the semiconductor substrate, and the lower electrode is made of a first conductive material, while the first and second contact plugs are made of a second conductive material different from the first conductive material.

BRIEF DESCRIPTION OF THE DRAWINGS

The above-mentioned and other objects, features, and advantages of the present invention will become more apparent by reference to the following detailed description of the present invention taken in conjunction with the accompanying drawings, wherein.

DESCRIPTION OF THE PREFERRED EMBODIMENTS

Figure 1:
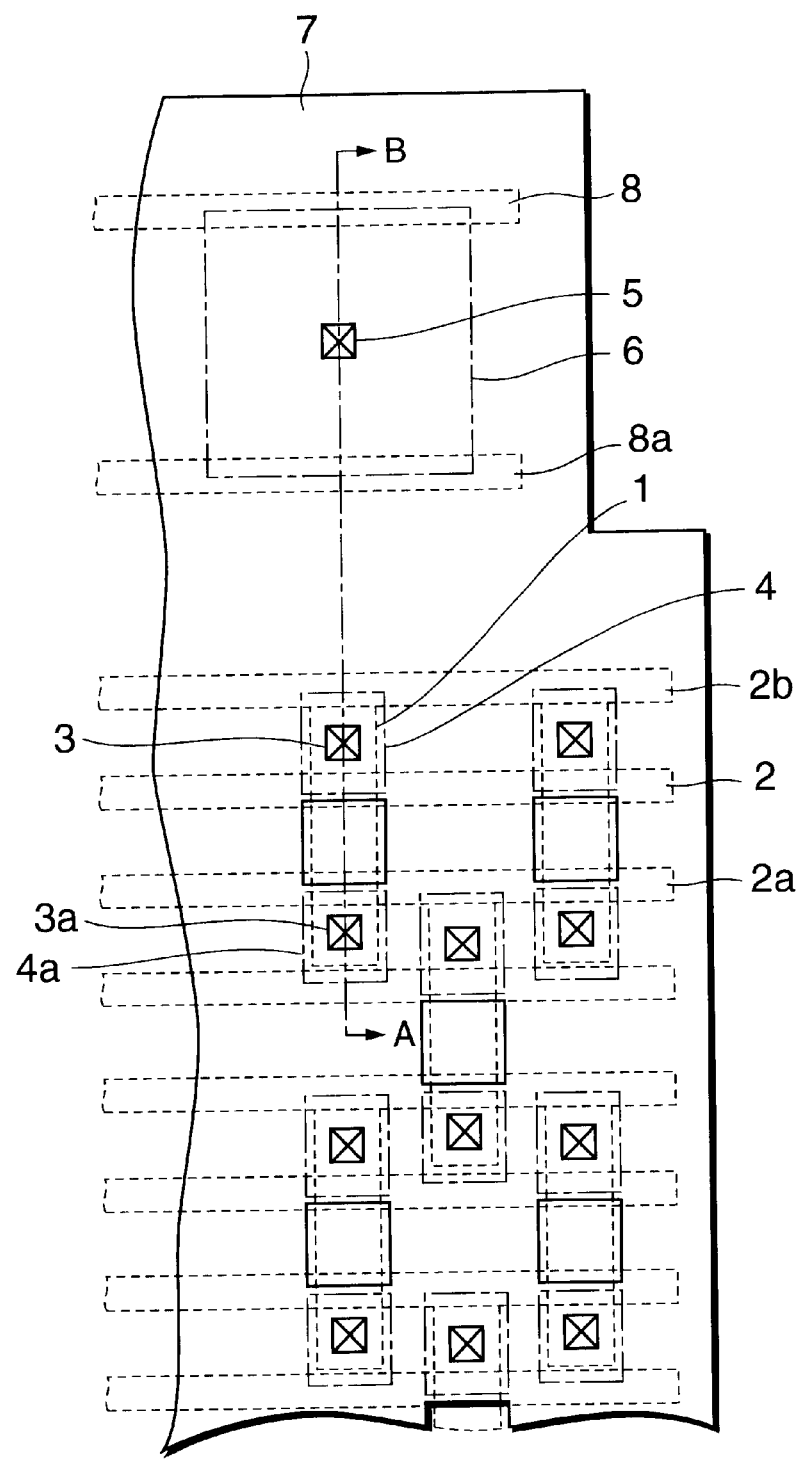
FIG. 1 is a plan view for showing a memory cell portion and a charging protection capacitor portion according to a first embodiment of the present invention.
Figure 2:
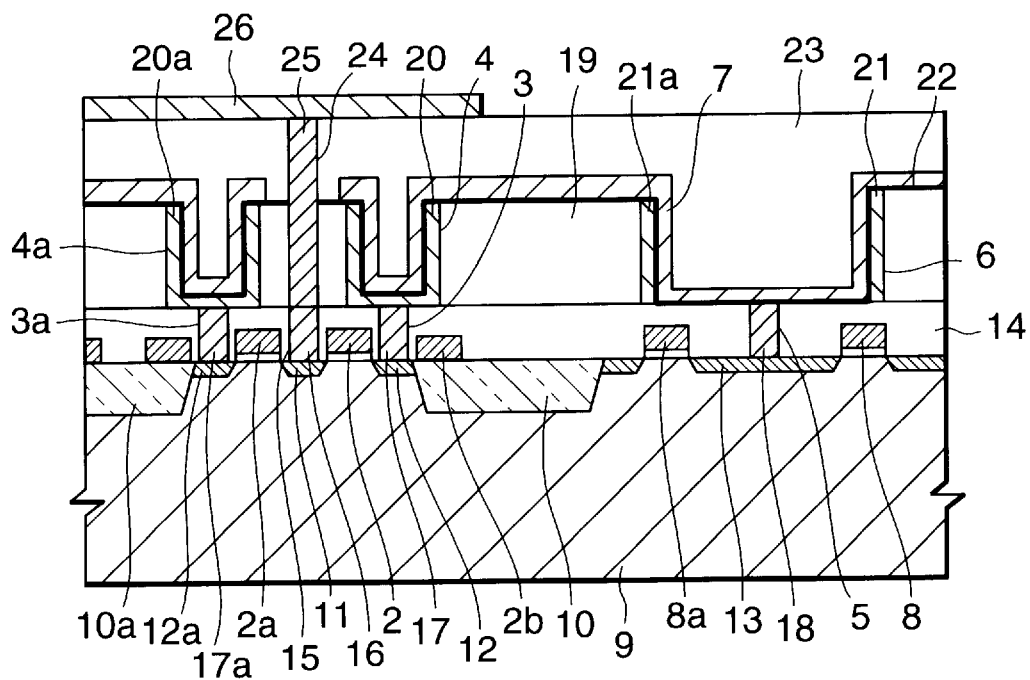
FIG. 2 is another plan view for showing the memory cell portion and the charging protection capacitor portion according to the first embodiment of the present invention.

The following will describe a first embodiment with reference to FIGS. 1–4. FIG. 1 is a plan view for showing an end of a memory cell. FIG. 2 is a cross-sectional view taken along line A–B of FIG. 1. It is here to be noted that only necessary components are shown to omit the others in FIG. 1 in order to simplify it.

As shown in FIG. 1 and described with reference to the paragraph of the prior art, an element activation region 1 is formed as surrounded by a trench element isolation region. In each of the element activation regions 1 are formed two memory cells. Word lines 2, 2a, 2b, . . . are arranged for the memory cells, in a capacitor portion of each of which are formed capacitor contact holes 3 and 3a, above which holes and in a later-described inter-layer insulator film are formed capacitor trenches 4 and 4a in the memory cell portion. Such a memory-cell structure is arranged many in a memory array.

Besides, by the present invention, a charging protection capacitor portion is provided. That is, like in the case of the above-mentioned memory cell portion, a charging protection contact hole 5 is formed, above which and in the later-described inter-layer insulator film is formed a charging protection trench 6. It is here to be noted that the charging protection trench 6 occupies a larger area than the capacitor trench 4 does. In this configuration, a cell plate electrode 7 is formed in such a manner as to cover all the surfaces of the above-mentioned memory cell region and the charging protection capacitor portion. It is here to be noted that this charging protection capacitor portion may have dummy word lines 8 and 8a formed thereon. Further, this charging protection capacitor portion may be provided more than one in the periphery of the memory cell portion.

The following will describe a construction of the memory cell portion and the charging protection capacitor portion that constitutes an inventive charging protection portion with reference to FIG. 2. As shown in FIG. 2, on a silicon substrate 9 are selectively formed trench element isolation regions 10 and 10a so as to surround the above-mentioned element activation region 1. Over the silicon substrate 9 and on the trench element isolation regions 10 and 10a are provided the word lines 2 and 2a, the word line 2b, etc. respectively through a gate insulator film that gives a transfer gate transistor of the memory cell portion and also, in which are formed a bit-line diffused layer and capacitor diffused layers 12 and 12a. These capacitor diffused layers 12 and 12a give the first diffused layer.

Similarly, in the charging protection capacitor portion are formed the dummy word lines 8 and 8a and a charging protection diffused layer 13. The charging protection diffused layer 13 gives the second diffused layer.

Then, a first inter-layer insulator film 14 is formed to flatten all the surfaces, so that in the memory cell portion a bit-line contact hole 15 is formed in the first inter-layer insulator film 14 so as to extend the above-mentioned bit-line diffused layer 11, in which bit-line contact hole 15 is buried a bit-line plug 16. Similarly, in the above-mentioned first inter-layer insulator film 14 are formed capacitor contact holes 3 and 3a so as to reach the capacitor diffused layers 12 and 12a, in which capacitor contact holes 3 and 3a are buried capacitor plugs 17 and 17a. It is here to be noted that the bit-line plug 16 and the capacitor plugs 17 and 17a are composed of a tungsten (W) film with a titanium nitride (TiN) film used as a barrier layer. These capacitor plugs 17 and 17a give the first contact plug.

Similarly, in the charging protection capacitor portion, the contact hole 5 is formed in the first inter-layer insulator film 14 so as to reach the charging protection diffused layer 13, in which charging protection contact hole 5 is buried a charging protection plug 18. It is here to be noted that the charging protection plug 18 is composed of a W film with a TiN film used as a barrier film. This charging protection plug 18 gives the second contact plug.

Then, on the above-mentioned first inter-layer insulator film 14 is formed a second inter-layer insulator film 19, so that in the memory cell portion, the capacitor trenches 4 and 4a are formed, on side surfaces and bottom surface of which are provided lower electrodes 20 and 20a. It is here to be noted that the lower electrodes 20 and 20a are composed of a TiN film. These capacitor trenches 4 and 4a give the first capacitor trench.

In the charging protection capacitor portion, on the other hand, the charging protection trench 6 occupying a larger area than the above-mentioned memory cell capacitor does is formed, only on the side surfaces of which trench 6 are formed side wall electrodes 21 and 21a but on the bottom surface of which is formed no electrode. This charging protection trench 6 gives the second capacitor trench.

Then, all over the surfaces is formed a capacitor insulator film 22, on which is provided the cell plate electrode 7, which provides the upper electrode. Then, a third inter-layer insulator film 23 is formed so as to cover the cell plate electrode 7, while in the memory cell portion is formed a through hole 24 in the third inter-layer insulator film 23 and the second inter-layer insulator film 19. Further, in the through hole 24 is buried a through-hole plug 25, so as to connect to which is provided a bit line 26.

As described above, according to the present invention, the memory capacitor has a construction consisting of upper electrode (cell plate electrode 7)/capacitor insulator film 22/lower electrode 20, in which the lower electrode 20 is connected to the capacitor plug 17. The charging protection capacitor, on the other hand, has a construction of upper electrode (cell plate electrode 7)/capacitor insulator film 22 in which the capacitor insulator film 22 is adhered to the charging protection plug 18.

The charging protection capacitor as having the above-mentioned construction, even if the cell plate electrode is charged with ions or electrons during a process of manufacturing a semiconductor device, these ions or electrons are released from the cell plate electrode 7 through the capacitor insulator film and the charging protection plug 18 to the charging protection diffused layer 13 as described with the prior art. Thus, the capacitor insulator film 22 is completely prevented from breaking down electrostatically.

The following will describe a method for manufacturing the charging protection capacitor portion and the memory cell portion of the present invention with reference to FIGS. 3 and 4. In the FIGS. 2, 3, and 4, the same components are indicated by the same reference symbols, to omit the explanation of those not essential.

Figure 3A:
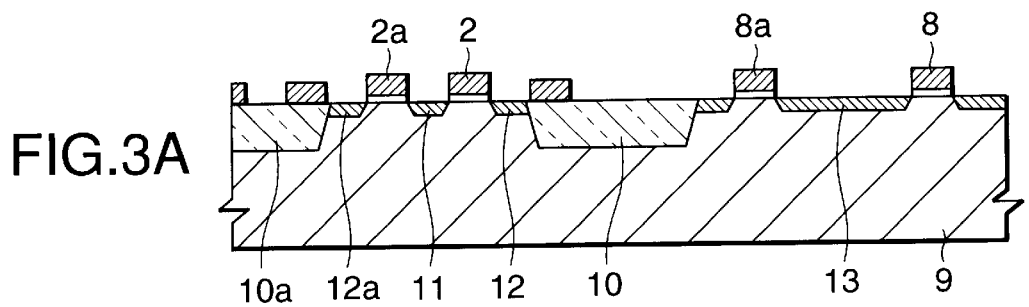
FIGS. 3A to 3D are cross-sectional views for showing sequential steps of manufacturing the memory cell portion and the charging protection portion according to the first embodiment of the present invention.

As shown in FIG. 3A, on the P type silicon substrate 9 are formed the trench element isolation regions 10 and 10a. The memory-cell word lines 2 and 2a are formed, to then form the N type bit-line diffused layer 11 and capacitor diffused layers 12 and 12a. Similarly, in the charging protection capacitor portion are formed the dummy word lines 8 and 8a and the n type charging protection diffused layer 13.

Figure 3B:
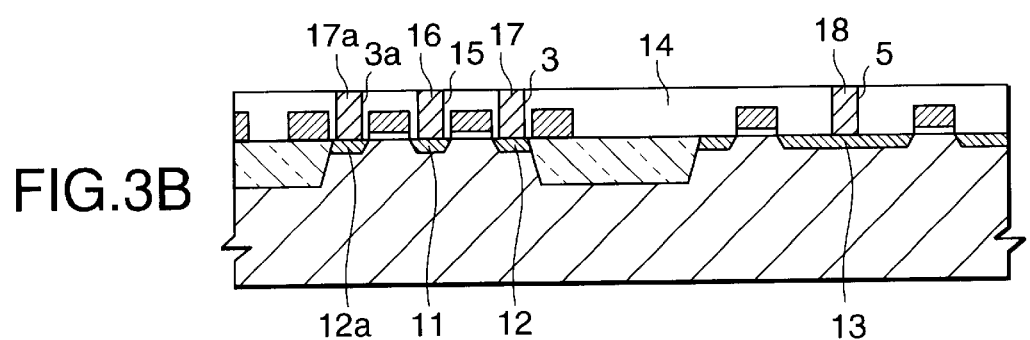

Next, as shown in FIG. 3B, all over the surfaces is formed the first inter-layer insulator film 14 made of a silicon oxide film to a thickness of 500 nm or so, while in the memory cell portion, the bit-line contact hole 15 is formed in the first inter-layer insulator film 14 so as to reach the above-mentioned diffused layer 11, in which bit-line contact hole 15 is buried the bit-line plug 16. Similarly, over the above-mentioned first inter-layer insulator film 14 are formed the capacitor contact holes 3 and 3a so as to reach the capacitor diffused layers 12 and 12a respectively, which capacitor diffused layers 3 and 3a are filled with the capacitor plugs 17 and 17a respectively. Similarly, in the charging protection capacitor portion, the charging protection contact hole 5 is formed in the first inter-layer insulator film 14 so as to reach the charging protection diffused layer 13, which charging protection diffused layer 13 is filled with the charging protection plug 18. It is here to be noted that the bit-line plug 16, the capacitor plugs 17 and 17a, and the charging protection plug 18 are composed of a W film with a TiN film used as a barrier layer.

Figure 3C:
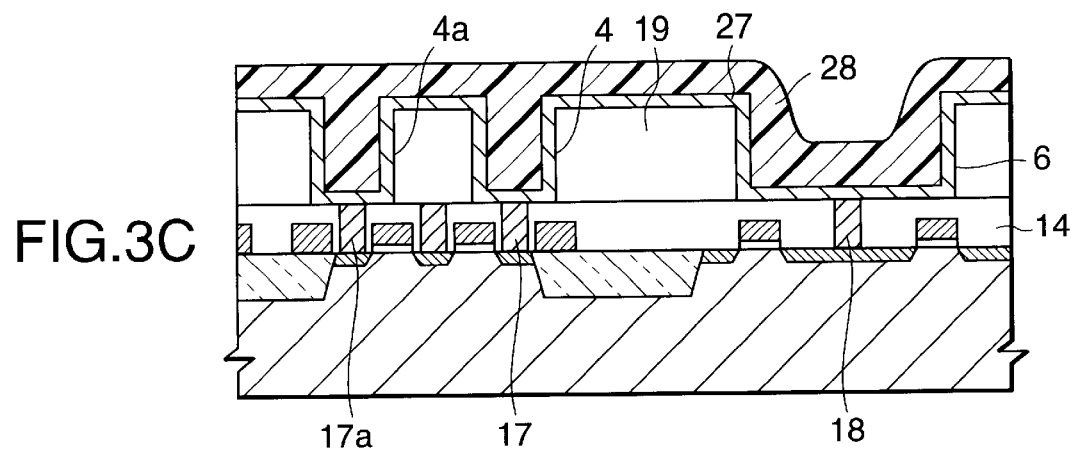

Next, as shown in FIG. 3C, on the above-mentioned first inter-layer insulator film 14 is formed the second inter-layer insulator film 19 made of silicon oxide to a film thickness of 1 $\mu$m, in the memory cell portion are provided the capacitor trenches 4 and 4a with an opening size of 0.2 $\mu$m or so, in the charging protection capacitor portion is provided the charging protection trench 6 with an opening size of 2 $\mu$m or so, and all over the surfaces is formed a lower-electrode metal film 27 with a film thickness of 20 nm or so.

Figure 3D:
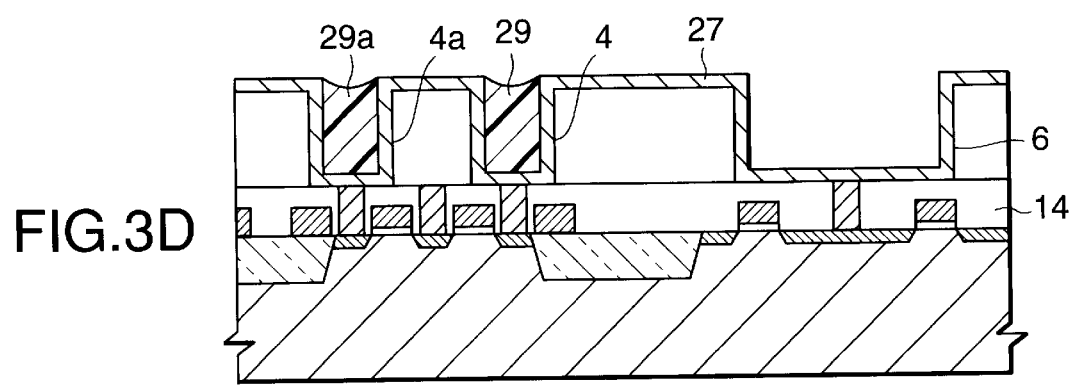

Next, a positive type resist film 28 is applied to a film thickness of 0.4 $\mu$m or so. This resist film 28 is exposed all over the surface and exposed. By doing so, as shown in FIG. 3D, charging resist films 29 and 29a remain on the capacitor trenches 4 and 4a respectively. The resist film 28 in the charging protection trench 6, on the other hand, is removed completely.

Figure 4A:
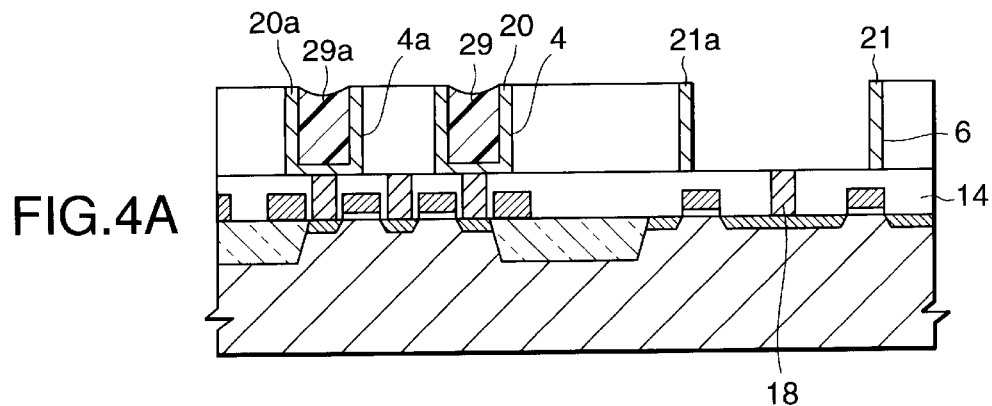
FIGS. 4A to 4C are cross-sectional views for showing sequential steps of manufacturing the memory cell portion and the charging protection portion following the manufacturing steps of FIG. 3.

Next, anisotropic overall etching (etch-back) is performed on the above-mentioned lower-electrode metal film 27. As a result of this etch-back step, as shown in FIG. 4A, in the capacitor trenches 4 and 4a are formed the lower electrodes 20 and 20a because they are not etched off by virtue of the above-mentioned charging resist films 29 and 29a respectively. At the above-mentioned etching step, on the other hand, no resist film is present on the charging protection capacitor portion, so that the side wall electrodes 21 and 21a are left as are on the side surfaces of the charging protection trench 6 but the lower-electrode metal film 27 is etched off from the bottom surface thereof, thus exposing the charging protection plug 18.

Figure 4B:
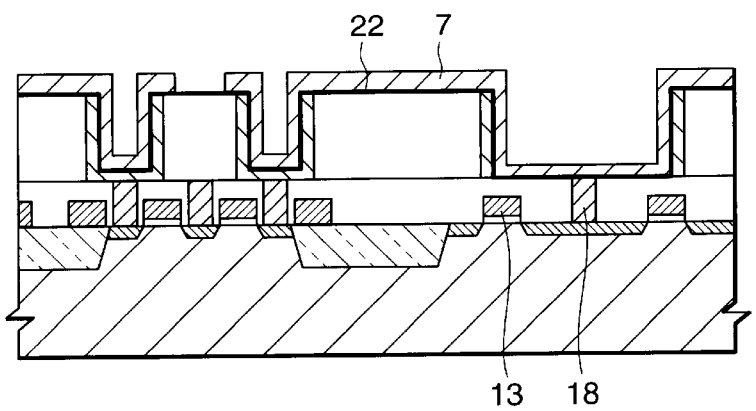

Next, as shown in FIG. 4B, the capacitor insulator film 2 made of tantalum penta-oxide is formed all over the surfaces to a film thickness of 10 nm. Then, a cell-plate metal film composed of a TiN film or a W/TiN stack film with a film thickness of 200 nm or so is formed to thereby pattern the above-mentioned cell-plate metal film using publicly known photolithographic and dry etching technologies, thus forming the cell plate electrode 7.

It is here to be noted that a very good degree of adhesion (close contacting) is given between the tantalum penta-oxide film that provides the above-mentioned capacitor insulator film 22 and the W film that provides the charging protection plug 18. Moreover, very good adhesion is provided between the above-mentioned tantalum penta-oxide film and the TiN film that provides the lower electrodes 20 and 20a.

Figure 4C:
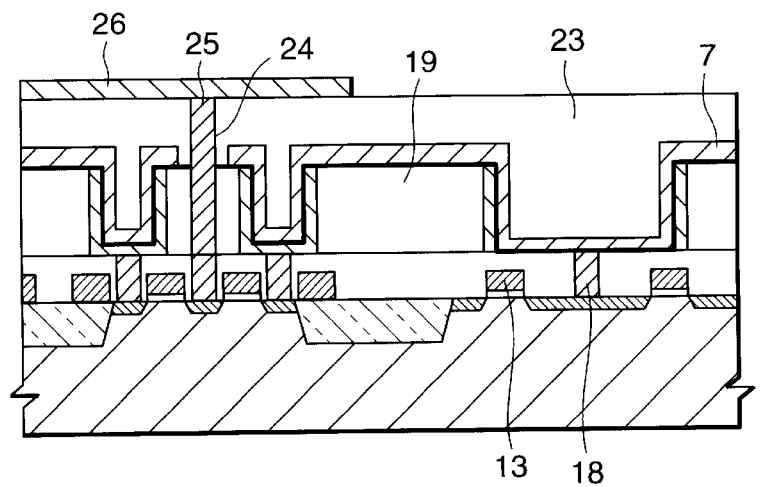

Next, as shown in FIG. 4C, a silicon oxide film formed to a film thickness of about 500 nm by the PECVD method by use of HDP is used to form the third inter-layer insulator film 23. In the memory cell portion, on the other hand, the through hole 25 is formed in the third inter-layer insulator film 23 and the second inter-layer insulator film 19 by dry-etching, which through hole 24 is filled with the through-hole plug 25, so as to connect to which is provided the bit line 26.

By the present invention, during the step described in FIG. 4B of dry-etching the cell plate metal film for forming the cell plate electrode 7 and the step described in FIG. 4C of PECVD for forming the third inter-layer insulator film 23, the ions or electrons that charged the cell plate electrode 7 are released from the above-mentioned cell plate electrode 7 of the charging protection capacitor portion through the capacitor insulator film 22 and the charging protection plug 18 to the charging protection diffused layer 13. The reasons for this discharge is detailed with reference to FIG. 5 later. Anyway, by doing so, it is possible to prevent electrostatic breakdown of the capacitor insulator film 22 completely. In addition, the ions or electrons produced during the dry etching step described in the prior art paragraph for forming the through hole 24 etc. can also be released.

According to the above-mentioned manufacturing method, a mask alignment step as use of photolithography described in FIG. 4A can be omitted in removing the lower-electrode metal film on the bottom surface of the charging protection trench 6 in the charging protection capacitor portion. Moreover, according to the present invention, electric charges produced on the lower-electrode metal film at the step of manufacturing the semiconductor device are released through the capacitor insulator film of the charging protection capacitor portion and the charging protection plug 18 to the charging protection diffused layer 13 or the silicon substrate 9. As such, according to the present invention, it is unnecessary to remove the capacitor insulator film of the charging protection capacitor portion, thus giving an effect of simplifying the semiconductor device manufacturing process.

The reasons why the above discharge phenomenon is possible are described as follows with reference to FIG. 5. As described above, in the charging protection capacitor, the upper electrode (cell plate electrode 7)/capacitor insulator film 22/charging protection plug 18 structure is made of TiN/TaO$_5$/W. In the memory cell capacitor, on the other hand, the upper electrode (cell plate electrode 7)/capacitor insulator film 22/lower electrode 20 structure 20 is made of TiN/TaO$_5$/TiN.

Figure 5:
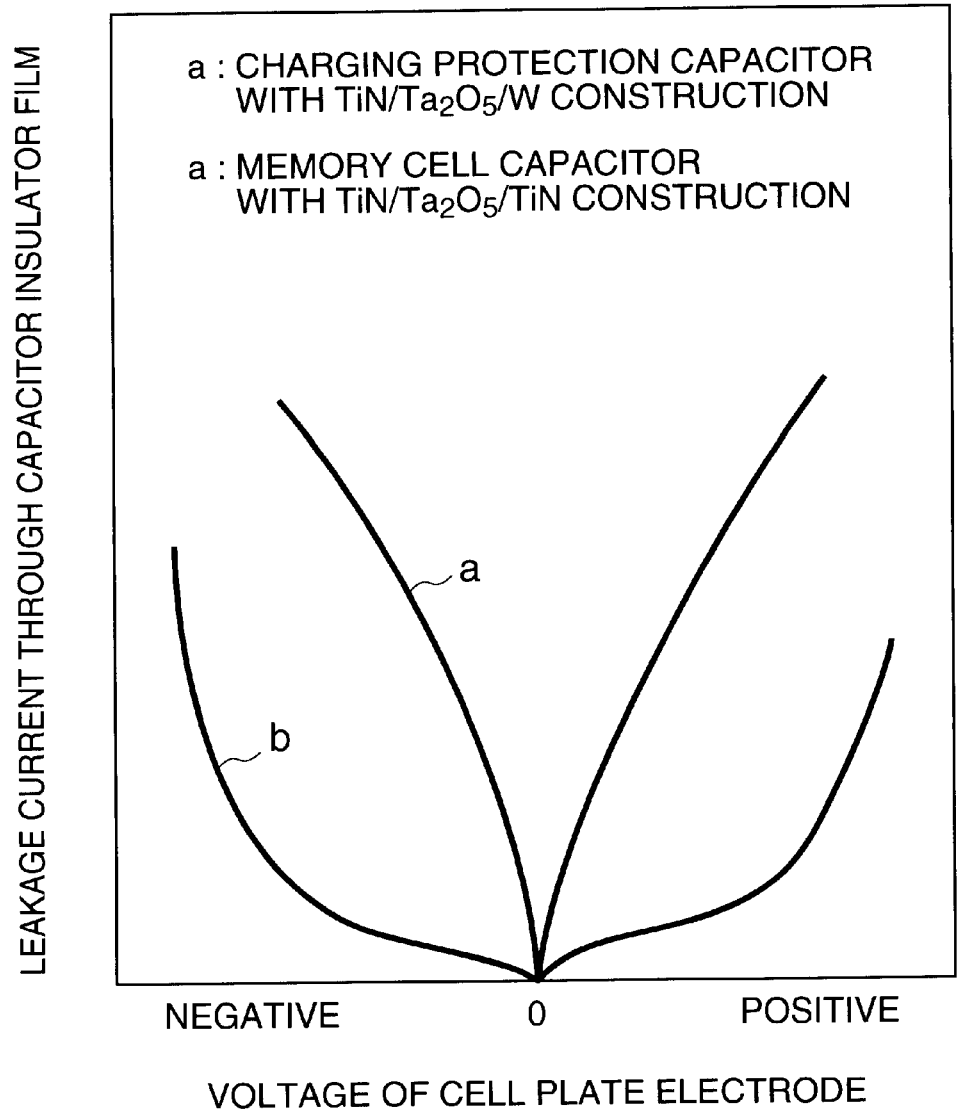
FIG. 5 is a graph for showing an insulation level of capacitor insulator films of the charging protection capacitor portion and the memory cell capacitor portion of the present invention.

FIG. 5 shows how the unit-area leakage current flowing through the capacitor insulator film indicated by the vertical axis changes with the changing voltage applied on the cell plate electrode indicated by the horizontal axis. In this case, the charging protection plug and the lower electrode which serve as an opposition electrode are grounded in potential.

As can be seen from FIG. 5, the unit-area leakage current flows through the capacitor insulator film more for the charging protection capacitor than for the memory cell capacitor. This increase in leakage current is independent on the polarity of the voltage applied to the cell plate electrode. This voltage on the cell plate electrode corresponds to the amount of ions or electrons produced at the above-mentioned manufacturing step. The charging protection capacitor as having such a construction, the ions or electrons are easily released from the above-mentioned cell plate electrode through the capacitor insulator film and the charging protection plug to the charging protection diffused layer, thus preventing electrostatic breakdown of the capacitor insulator film completely.

Figure 6A:
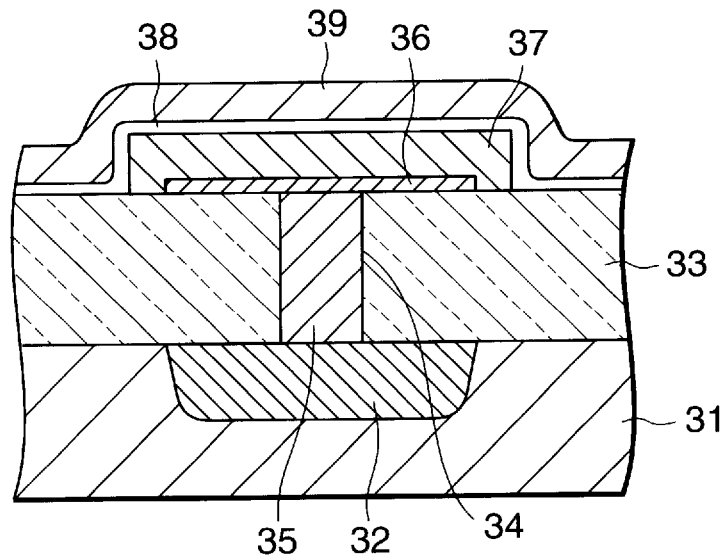
FIGS. 6A and 6B are cross-sectional views for showing the memory cell portion and the charging protection capacitor portion according to a second embodiment of the present invention.
Figure 6B:
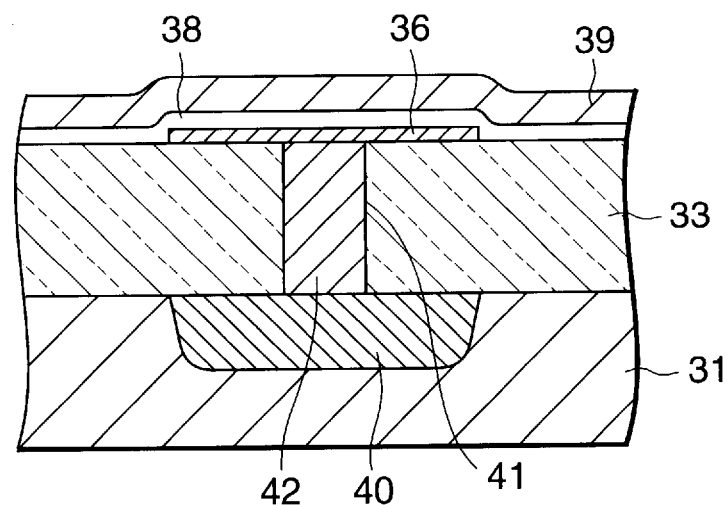
Figure 7:
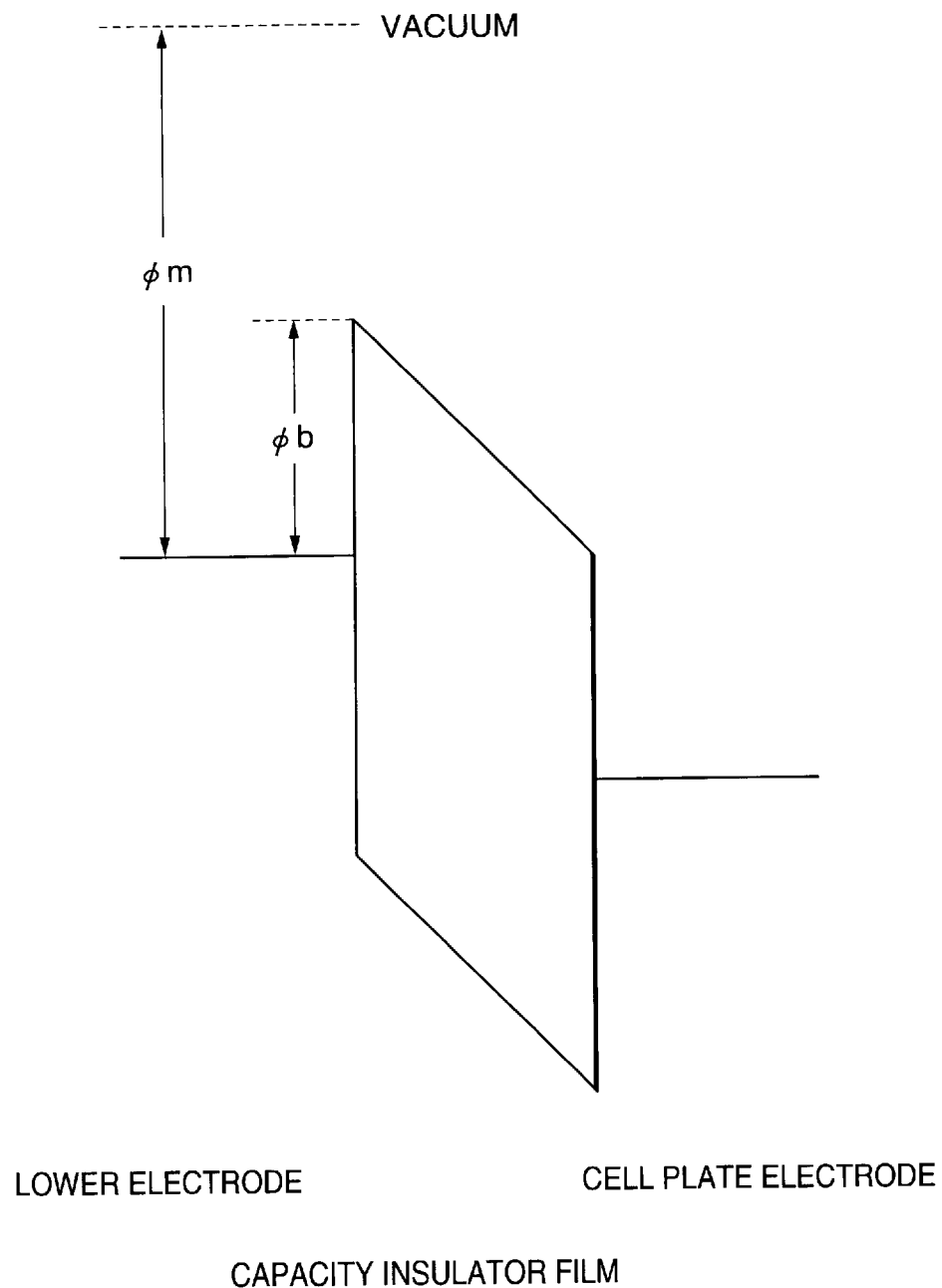
FIG. 7 is a band diagram for explaining an MIM construction capacitor of the present invention.
Figure 8:
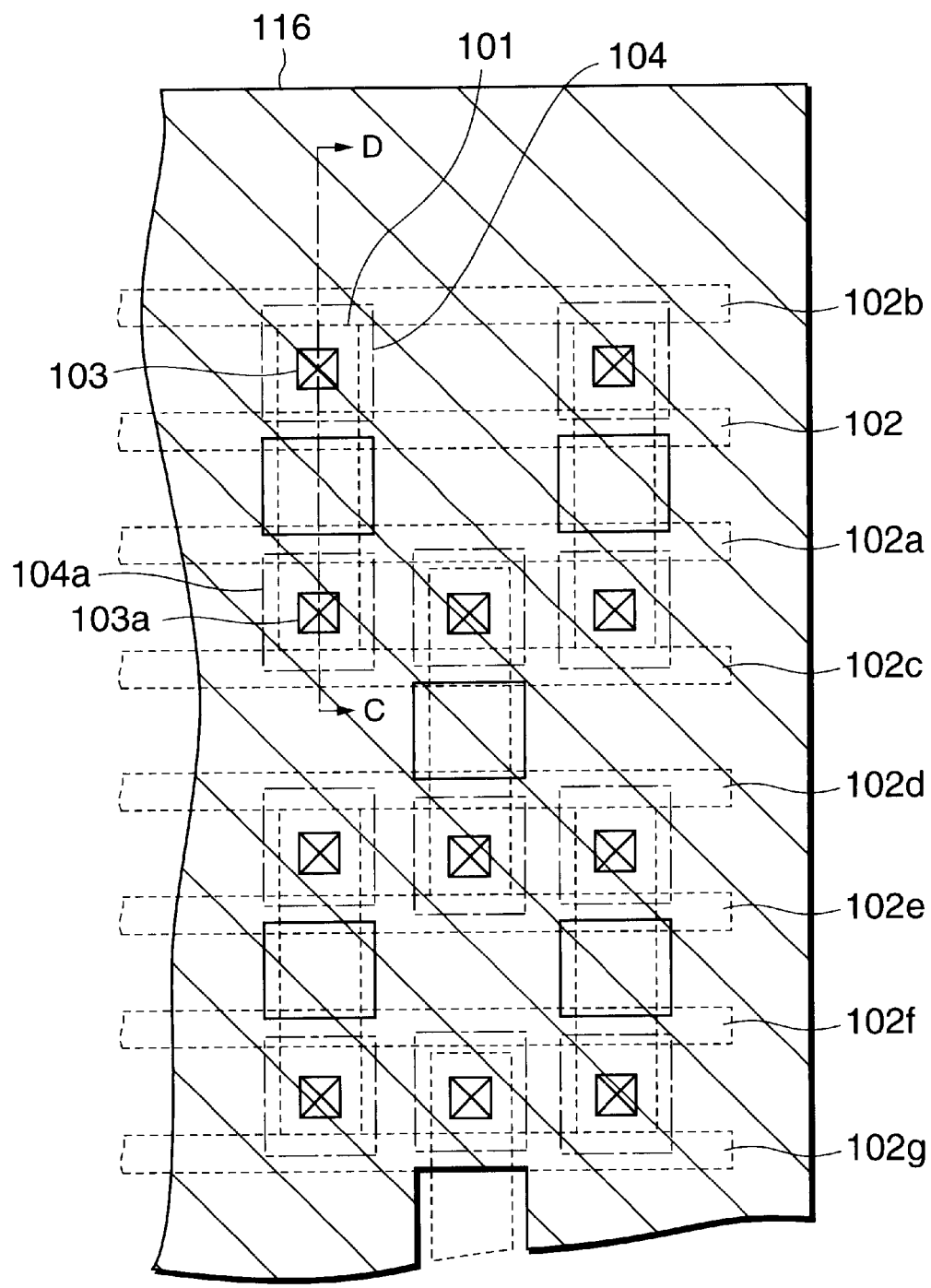
FIG. 8 is a plan view for showing a conventional memory cell portion.
Figure 9A:
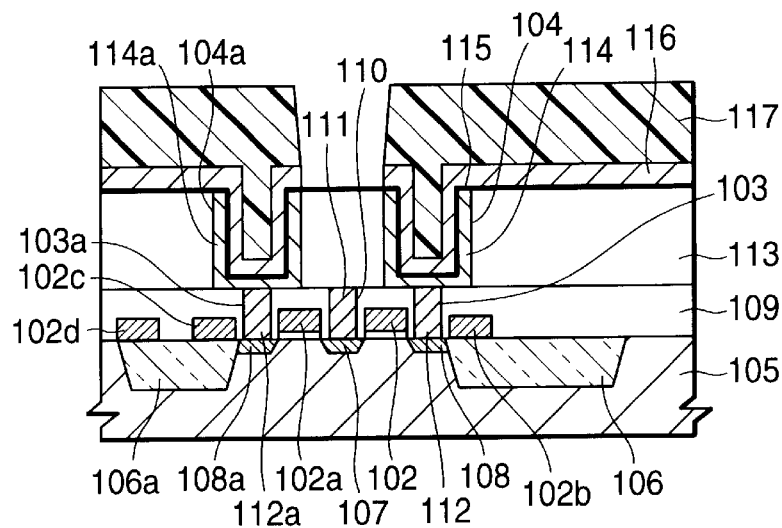
FIGS. 9A to 9C are cross-sectional views for showing sequential steps of manufacturing the conventional memory cell portion.
Figure 9B:
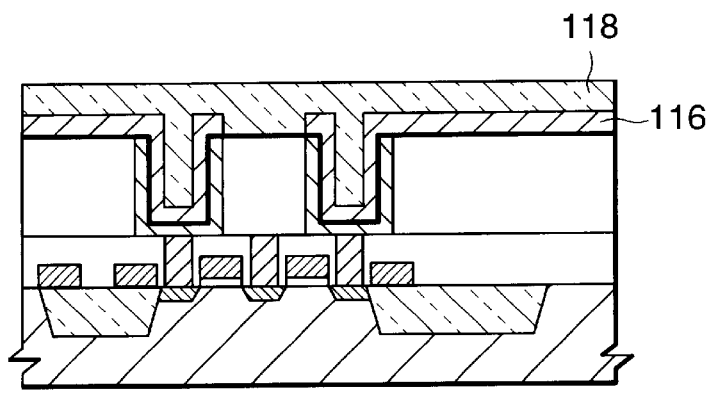
Figure 9C:
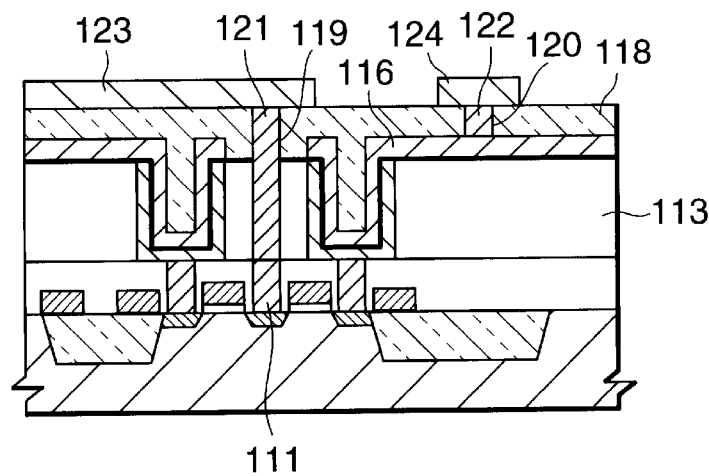

The following will describe a second embodiment of the present invention with reference to FIGS. 6 and 7. FIG. 6A is a schematic cross-sectional view of the memory cell capacitor and FIG. 6B is a schematic cross-sectional view of the charging protection capacitor portion. It is here to be noted that these capacitors are of an MIM construction in which the capacitor insulator film is made of a high-permittivity material.

As shown in FIG. 6A, in the memory cell capacitor, in a predetermined region of a silicon substrate 31 is formed a capacitor diffused layer 3 32, so that a capacitor contact hole 34 is formed in an inter-layer insulator film 33 so as to reach this capacitor diffused layer 32. This capacitor contact hole 34 is filled with a capacitor plug 35.

In this case, further, the lower electrode is made of at least two types of conductive materials stacked. In FIG. 6A, a first lower electrode 36 and a second lower electrode 37 constitute the lower electrode. So as to cover the surfaces of the second lower electrode 36 and the inter-layer insulator film 33 is formed a capacitor insulator film 38, on which is in turn formed a cell plate electrode 49.

The charging protection capacitor portion, on the other hand, is different in construction from the memory cell capacitor portion in that the second lower electrode 37 is removed. That is, as shown in FIG. 6B, on the silicon substrate 31 is formed a charging protection diffused layer 40, so that a charging protection contact hole 41 is formed in the inter-layer insulator film 33 so as to reach this charging protection diffused layer 40, which charging protection contact hole 41 is filled with a charging protection plug 42. So as to connect to this charging protection plug 42 is formed the first lower electrode 36, on the surfaces of which first lower electrode 36 and the inter-layer insulator film 33 is formed the capacitor insulator film 38, on which is in turn formed the cell plate electrode 39.

Thus constructed memory cell capacitor and charging protection capacitor are arranged on a semiconductor chip according to such a layout as shown in FIG. 1 described in the first embodiment.

The method for manufacturing an electrode portion constituting the above-mentioned memory cell capacitor and charging protection capacitor may be outlined as follows. That is, the capacitor contact hole 34 and the charging protection contact hole 41 shown in FIG. 6 are respectively filled with the capacitor plug 35 and the charging protection plug 42 formed of a W film with a TiN film used as a barrier layer. Then, to begin with, the first lower electrode 36 and the second lower electrode 37 are formed as stacked on the memory capacitor portion and the charging protection capacitor portion respectively. It is here to be noted that the first lower electrode 36 is formed of a W film and the second lower electrode 37, of a TiN film.

Next, only the second lower electrode 37 of the charging protection capacitor portion is etched off to leave the first lower electrode 36 as it. Then, the capacitor insulator film 38 is formed all over the surfaces, to form the cell plate electrode 39 of the W-film/TiN-film stacked layer. It is here to be noted that in forming the above-mentioned capacitor insulator film 38, atomic-layer CVD (ALCVD) is very effective. By this method, each atomic layer or each few atomic layers are formed, thus greatly improving the insulation level of the formed capacitor insulator film.

It is here to be noted that as mentioned above, the degree of adhesion (close contacting) is very good between the capacitor insulator film made of tantalum penta-oxide and the first and second lower electrodes.

Like in the case of the first embodiment, in this embodiment also, the electric charge produced on the cell plate electrode 39 at the manufacturing step is released through the capacitor insulator film 38, the first lower electrode 36, and the charging protection plug 42 to the charging protection diffused layer 40 or the silicon substrate 31. It is, therefore, necessary to select such a conductive material of the first lower electrode 36 as to increase the leakage current flowing through the capacitor insulator film 38. In the memory cell capacitor, on the other hand, it is necessary to decrease the leakage current flowing through the capacitor insulator film 38. Such a conductive material needs to be selected as the material of the above-mentioned second lower electrode.

As such, the inventor discussed in detail a conductive material constituting the above-mentioned first and second lower electrodes. As a result, the inventor found that the leakage current flowing through the capacitor insulator film is greatly dependent on a work function ($\Phi m$) value of the conductive material constituting the lower electrodes. That is, as the $\Phi m$ value of the lower electrode decreases, the leakage current flowing through the capacitor insulator film increases, and as the $\Phi m$ value increases, the leakage current flowing through the capacitor insulator film decreases, thus improving the insulation level. It is here to be noted that the leakage current flowing through such a capacitor insulator film greatly depends on how it is formed.

The following will outline a relationship between the above-mentioned leakage current and $\Phi m$ value with reference to FIG. 7. FIG. 7 shows a band diagram when the cell plate electrode is charged positive in the MIM construction (cell plate electrode/capacitor insulator film/lower electrode). As shown in FIG. 7, the capacitor insulator film has the conductive band, the forbidden band, and the valence band. It is here to be noted that the leakage current flowing through the capacitor insulator film is greatly dependent on a barrier height $\Phi b$ between the Fermi level of the lower electrode and the above-mentioned conductive band. That is, as the $\Phi b$ value decreases, the leakage current flowing through the capacitor insulator film increases, while the $\Phi b$ value increases, the leakage current flowing through the capacitor insulator film decreases. It is here to be noted that the $\Phi b$ value, which depends on the capacitor insulator film, increases with the increasing value of $\Phi m$ and decreases with the decreasing value thereof. From the above, it was found that in the present invention, the first lower electrode 36 should be made of a conductive material with a small value of $\Phi m$ and the second lower electrode 37 be made of a conductive material with a large value of $\Phi m$. Moreover, in the present invention, it is important that the adhesion degree should be good between the above-mentioned first lower electrode and capacitor insulator film. The above description applies also to the first embodiment.

According to the present invention, the conductive material of the lower electrode or the charging protection plug of the charging prevention capacitor is selected as described above, thereby increasing the leakage current flowing through the capacitor insulator film. It is thus totally unnecessary to selectively remove the capacitor insulator film of the charging protection capacitor, which provides the charging protection portion. It also eliminates the necessity of the step of forming a resist mask by applying a resist film on the capacitor insulator film in order to selectively remove the capacitor insulator film, the step of selecting etching this capacitor insulator film, etc. In this case, however, if a resist film is applied onto the capacitor insulator film, its quality is deteriorated. The present invention can eliminates such a deterioration completely for the above-mentioned reasons. The present invention thus makes it possible to mass-produce, at a high yield, a high-quality capacitor having an MIM construction in which the capacitor insulator film is made of such a high-permittivity material as a metal oxide.

The following will specifically describe the conductive material of the first and second lower electrodes with reference to the following table 1.

TABLE 1

|  | Capacitor (I) | Capacitor (II) |
|---|---|---|
| Capacitor insulator film | $Ta_2O5$, $Al_2O_3$, $PrO_2$, $Pr_2O_3$, $HfO_2$, $TrO_2$, $ZrSiO_4$ | $(Ba,Sr)TiO_3$, $SrTiO_3$, $Pb(Zr,Ti)O_3$ |
| First lower electrode | Ti, Ta, TaN, W | Ti, Ta, TaN, W |
| Second lower electrode | TiN, Mo, MoN, WN | Ru, $RuO_2$, Ir, $IrO_2$, Pt, Pd, Rh, Os |
| Cell plate electrode | W, TiN, Mo, MoN, WN | Ru, $RuO_2$, Ir, $IrO_2$, Pt, Pd |

In Table 1, the capacitors of the memory cell portion are classified into a capacitor (I) and a capacitor (II) based on the type of the capacitor insulator film. In the case of the capacitor (I), the capacitor insulator film has a dielectric constant of a few tens, while in the case of the capacitor (II), it has a dielectric constant of 100 or larger. It is here to be noted that the electrode construction of the charging protection capacitor is the same as that of Table 1 except the second lower electrode is removed, as described with reference to FIG. 6.

As shown in Table 1, in every type of the capacitor insulator film, the first lower electrode is made of such a conductive material as titanium (Ti), tantalum (Ta), tantalum nitride (TaN), or tungsten (W). It is here to be noted that the capacitor insulator film should preferably be formed by the ALD method. It is thus possible to increase the leakage current through the charging protection capacitor.

In the case of a capacitor insulator film that constitutes the capacitor (I), on the other hand, the second lower electrode is made of such a conductive material as TiN, molybdenum (Mo), Molybdenum nitride, or tungsten nitride (WN). In the case of a capacitor insulator film that constitutes the capacitor (II), in turn, the second lower electrode is made of such a conductive material as ruthenium (Ru), ruthenium dioxide ($RuO_2$), iridium (Ir), iridium dioxide ($IrO_2$), platinum (Pt), or palladium (Pd). By using such a material, it is possible to greatly decrease the leakage current flowing through the memory cell capacitor.

It is here to be noted that such films as indicated in Table 1 may be stacked to form the above-mentioned capacitor insulator film. Alternatively, they may be combined with an extremely thin silicon oxide film or silicon nitride film to form the stack. Further alternatively, the above-mentioned first or second lower electrode may be a stacked layer. When such a stacked-layer electrode is used, the above-mentioned conductive material is to be selected as the material of the upper part of the above-mentioned first or second lower electrode.

Furthermore, as mentioned above, it is important especially to enhance the adhesion strength between the capacitor insulator film and the first lower electrode. This is because poor adhesion decreases the leakage current. It is, therefore, necessary to take into account the combination of the above-mentioned conductive materials of the first lower electrode and the high-permittivity materials of the capacitor insulator film.

As described above, the second embodiment employs different conductive materials for the lower electrode of the memory cell capacitor and that of the charging protection capacitor, thereby giving almost the same effects as the first embodiment.

The above embodiments have been described with a reference to a case where the memory cell capacitor is protected from breaking down electrostatically during the manufacturing process. The present invention is not limited thereto. For example, the present invention is similarly applicable also to a case where such a large-area capacitor portion as to constitute an analog circuit is protected from breaking down electrostatically during the manufacturing process. In such a case, the above-mentioned contact plug is not always necessary. Moreover, the present invention is applicable similarly to a semiconductor device such as a FeRAM, in which a ferro-electric substance is used in a capacitor portion thereof. In such a case, the contact plug is electrically connected to a wiring line layer etc. and finally to a diffused layer in the surface of the semiconductor substrate.

Further, in the above embodiments, the conductivity type of the charging protection diffused layers 13 and 40 has been opposite to that of the silicon substrate. According to the present invention, however, they may be of the same conductivity type.

Furthermore, the first embodiment has employed different conductive materials for the lower electrode of the memory cell capacitor and the charging plug of the charging protection capacitor. It also has employed a TiN film to form the lower electrode and a W film to form the charging plug. By the first embodiment, however, for the reasons described in the second embodiment, almost the same effects can be obtained by using Mo, MoN, or WN as a conductive material of the lower electrode of the memory cell capacitor and Ti, TaN, or TaN as that of the above-mentioned charging plug.

Furthermore, the above-mentioned first embodiment has employed the same material for the capacitor plug of the memory cell capacitor portion and the charging protection plug of the charging protection capacitor portion. The present invention is not limited thereto. That is, these capacitor plus and charging protection plug may be made of different conductive materials. For example, the lower part of the charging protection plug is made of the same material as that of the capacitor plug but the upper part thereof is made of a different material. By doing so, it is possible to increase the leakage current flowing through the charging protection capacitor portion when the cell plate electrode is charged, thus improving the protection capability of the memory cell capacitor.

Furthermore, the above embodiments have been described with reference to a case where the inter-layer insulator film is made of silicon oxide. The present invention is not limited thereto. For example, the inter-layer insulator film may be formed of a silsesquioxane group film or a silica film containing at least one of a Si—H bond, a Si—$CH_3$ bond, and a Si—F bond. It is here to be noted that the silsesquioxane group insulator film is a Si—O-based dielectric film, which includes such low-permittivity materials as silsesquioxane-group hydrogen silsesquioxane, methyl silsesquioxane, methylated hydrogen silsesquioxane, or fluorinated silsesquioxane.

The present invention is not limited to the above-mentioned embodiments but may be changed in embodiment appropriately within a scope of the technological concept thereof.

As described above, by the present invention, to facilitate increasing a leakage current through capacitor insulator film of a charging protection capacitor portion, a contact plug or a lower electrode is formed as to as be in contact with the capacitor insulator film in this region, these components being made of appropriately selected conductive materials.

In this configuration, during the step of manufacturing a semiconductor device, even when a cell plate electrode (upper electrode) of a capacitor portion such as a memory capacitor of the semiconductor device is charged by ions or electrodes, these ions or electrons are easily passed from this cell plate electrode arranged commonly to these charging protection capacitor portions through the capacitor insulator film of the charging protection capacitor portion and released to the semiconductor substrate or the diffused layer. The capacitor insulator film of the capacitor portion can be completely prevented from breaking down electrostatically.

Furthermore, according to the present invention, just a simple method can be used to mass-produce at a high yield a capacitor having an MIM-construction in which a capacitor insulator film is made of metal oxide, a high-permittivity material. This greatly promotes improvements in integration density and fine patterning of the semiconductor device.

Although the present invention has been described with reference to specific embodiments, this description is not meant to be construed in a limiting sense. Various modifications of the disclosed embodiments will become apparent to persons skilled in the art upon reference to the description of the present invention. It is therefore contemplated that the appended claims will cover any modifications or embodiments as fall within the true scope of the present invention.

What is claimed is:

1. A semiconductor device, comprising:
   a capacitor portion comprising a lower electrode, a capacitor insulator film, and an upper electrode which are sequentially stacked in this order on an inter-layer insulator film on a semiconductor substrate; and
   a charging protection portion sharing said upper electrode and said capacitor insulator film,
   and having a conductor layer that is provided in direct contact with said capacitor insulator film at a lower part of said capacitor insulator film,
   said lower electrode comprising a first conductive material, said conductor layer comprising a second conductive material different from said first conductive material, and a path being formed along which charge produced on said upper electrode is released through said capacitor insulator film of said charging protection portion to said conductor layer.

2. A semiconductor device, comprising:
   a capacitor portion comprising a lower electrode, a capacitor insulator film, and an upper electrode which are sequentially stacked in this order on an inter-layer insulator film on a semiconductor substrate; and
   a charging protection portion sharing said upper electrode and said capacitor insulator film,
   wherein said lower electrode is electrically connected through a first contact plug provided in said inter-layer insulator film finally to a first diffused layer provided in a surface of said semiconductor substrate, said capacitor insulator film of said charging protection portion is in direct contact with a second contact plug provided in said inter-layer insulator film, said second contact plug is electrically connected to a second diffused layer formed in said semiconductor substrate surface, and said lower electrode comprises a first conductive material and said first and second contact plugs comprise a second conductive material different from said first conductive material.

3. The semiconductor device according to claim 2, wherein said capacitor portion and said charging protection portion are formed in different capacitor trenches provided in said inter-layer insulator film.

4. The semiconductor device according to claim 2, wherein an upper part of said second contact plug is replaced by a third conductive material.

5. A semiconductor device, comprising:
   a capacitor portion including a capacitor portion lower electrode formed by stacking and interconnecting a first lower electrode and a second lower electrode in this order on an inter-layer insulator film on a semiconductor substrate, a capacitor insulator film, and an upper electrode; and
   a charging protection portion that shares said capacitor insulator film and said upper electrode and that is provided with a charging protection portion lower electrode formed as a part of said first lower electrode used in said capacitor portion and positioned at a location different from that of said first lower electrode of said capacitor portion,
   wherein said first lower electrode of said capacitor portion is electrically connected through a first contact plug provided in said inter-layer insulator film finally to a first diffused layer provided in a semiconductor substrate surface, said lower electrode of said charging protection portion is in direct contact with said capacitor insulator film and electrically connected through a second contact plug provided in said inter-layer insulator film finally to a second diffused layer provided in said semiconductor substrate surface, and said second lower electrode comprises a first conductive material and said first lower electrode comprises a second conductive material different from said first conductive material.

6. The semiconductor device according to claim 5, wherein said capacitor portion constitutes a memory cell of said semiconductor device.

7. The semiconductor device according to claim 2, wherein a work function ($\Phi m$) of said second conductive material and said third conductive material is set smaller than a work function ($\Phi m$) of said first conductive material.

8. The semiconductor device according to claim 7, wherein said first conductive material comprises any one of TiN, Mo, MoN, WN, Ru, $RuO_2$, Ir, $IrO_2$, Pt, and Pd and said second and third conductive materials comprise any one of W, Ti, Ta, and TaN.

9. The semiconductor device according to claim 2, wherein said capacitor insulator film comprises a metal oxide film and said metal oxide film comprises any one of $TaO_5$, $ZrO_2$, $HfO_2$, $SrTiO_2$, $TiO_3$, and $PbO_3$.

10. The semiconductor device according to claim 5, wherein a work function ($\Phi m$) of said second conductive material and said third conductive material is set smaller than a work function ($\Phi m$) of said first conductive material.

11. The semiconductor device according to claim 5, wherein said capacitor insulator film comprises a metal oxide film and said metal oxide film comprises any one of $Ta_2O_5$, $ZrO_2$, $HfO_2$, $SrTiO_2$, $TiO_3$, and $PbO_3$.

* * * * *